US006313015B1

United States Patent
Lee et al.

(10) Patent No.: US 6,313,015 B1
(45) Date of Patent: Nov. 6, 2001

(54) GROWTH METHOD FOR SILICON NANOWIRES AND NANOPARTICLE CHAINS FROM SILICON MONOXIDE

(75) Inventors: Shuit-Tong Lee; Ning Wang; Chun-Sing Lee; Igor Bello, all of Hong Kong (HK)

(73) Assignee: City University of Hong Kong, Kowloon (HK)

(*) Notice: Subject to any disclaimer, the term of this patent is extended or adjusted under 35 U.S.C. 154(b) by 0 days.

(21) Appl. No.: 09/328,834

(22) Filed: Jun. 8, 1999

(51) Int. Cl.[7] .................................................. H01L 21/20
(52) U.S. Cl. ........................... 438/478; 117/87; 438/962
(58) Field of Search .................................. 438/478, 479, 438/481, 483, 488, 487, 503, 507, 940, 931, 962, 47; 427/248.1, 256; 117/84, 87

(56) References Cited

U.S. PATENT DOCUMENTS

| 5,581,091 | * | 12/1996 | Muskovits et al. ................ 257/9 |
| 5,783,498 | * | 7/1998 | Dotta ................................ 438/778 |
| 5,866,204 | * | 2/1999 | Robbie et al. ..................... 427/256 |
| 6,087,197 | * | 7/2000 | Eriguchi et al. .................... 438/42 |
| 6,103,540 | * | 8/2000 | Russell et al. ...................... 438/22 |

OTHER PUBLICATIONS

Wang et al "Si Nanowires Grown From Silicon–Oxide", Chemical Physics Letters 299 (1999) 237–242.*
Alfredo M. Morales, et al.; "A Laser Ablation Method for the Synthesis of Crystalline Semiconductor Nanowires"; *Science*; Jan. 9, 1998; vol. 279, pp. 208–211.
Y.F. Zhang, et al.; "Silicon nanowires prepared by laser ablation at high temperature"; *Applied Physics Letters*; Apr. 13, 1998; vol. 72, No. 15, pp. 1835–1837.
N. Wang, et al.; "Transmission electron microscopy evidence of the defect structure in Si nanowires synthesized by laser ablation"; *Chemical Physics Letters*; Feb. 13, 1998; pp. 368–372.

* cited by examiner

*Primary Examiner*—Savitri Mulpuri
(74) *Attorney, Agent, or Firm*—Merchant & Gould P.C.

(57) ABSTRACT

Silicon nanowires and silicon nanoparticle chains are formed by the activation of silicon monoxide in the vapor phase. The silicon monoxide source may be solid or gaseous, and the activation may be by thermal excitation, laser ablation, plasma or magnetron sputtering. The present invention produces large amounts of silicon nanowires without requiring the use of any catalysts that may cause contamination.

11 Claims, 8 Drawing Sheets

3 nm

**Nucleation and growth mechanisms for Si nanowires.
The parallel lines indicate the < 112 > orientation.**

Si oxide vapor phase deposits and forms the matrix first.
Then Si nanoparticles precipitate.
Preferred oriented nanoparticles grow fast and form nanowires.
Non-preferred oriented nanoparticles may form nanoparticle chains.

Nucleation and growth mechanisms for Si nanowires. The parallel lines indicate the < 112 > orientation.

Si oxide vapor phase deposits and forms the matrix first.
Then Si nanoparticles precipitate.
Preferred oriented nanoparticles grow fast and form nanowires.
Non-preferred oriented nanoparticles may form nanoparticle chains.

GROWTH METHOD FOR SILICON NANOWIRES AND NANOPARTICLE CHAINS FROM SILICON MONOXIDE

FIELD OF INVENTION

This invention relates to a method of using silicon monoxide or suboxide for the growth of high-purity silicon nanowires and silicon nanoparticle chains in bulk-quantity.

BACKGROUND OF THE INVENTION

Materials engineering at the nanometer scale can provide smaller devices than those currently available. In particular, research on semiconductor nanostructures with size-dependent optical and electronic properties, such as quantum-dots, one-dimensional quantum wire transistors and light emitting devices with extremely low power consumption is motivated by potential applications. Silicon is a material of great interest for nanostructures because of its important role in the field of microelectronics.

Since the 1960's, silicon whiskers grown by the vapor-liquid-solid (VLS) reaction have been extensively studied. After the VLS technique, many efforts have been made to further improve the synthesis of silicon nanowires by employing different techniques, such as photolithography technique combined with etching and scanning tunneling microscopy. These methods are tedious and normally produce only a limited number of strands of nanowires. Recently, silicon nanowires have been synthesized by laser ablation of metal-containing silicon targets (Wang, et al., Chemical Physics Letter, 283, p.368, 1998; Zhang et al., Applied Physics Letter, 72, p.1835, 1998; Morales et al., 279, p. 208, 1998). However, since metals were used as a catalyst, this method is in fact an extension of the VLS technique. The drawbacks of the VLS technique in producing nanowires are (1) contamination by the metal catalyst and (2) the extremely low yield of production, Therefore, one of the challenging issues in the field of silicon nanostructures has been the synthesis of high-quality, high purity silicon nanowires in large quantities.

SUMMARY OF INVENTION

The present invention provides a method for producing large quantity of silicon nanowires and nanoparticle chains in a large- area from silicon monoxide or suboxide on any kind of substrates without using metal or other catalysts.

According to the present invention there is provided a method of forming silicon nanowires comprising activating vapor phase silicon monoxide or suboxide (ie $Si_xO$ where $x \geq 1$) carried in an inert gas.

The vapor phase silicon monoxide or suboxide may be obtained directly from a gaseous source or from a solid source. When a solid source is used, the solid source may comprise silicon monoxide itself, or may comprise silicon dioxide and silicon that may react together (possibly with the addition of Ge) to produce silicon monoxide.

Activation of the vapor phase may be by one of a number of methods including thermal excitation, laser ablation, chemical vapor deposition, plasma or magnetron sputtering.

The inert gas is preferably selected from the group consisting of neon, argon and helium and mixtures thereof.

The ambient conditions, notably temperature and pressure may determine the diameter of the nanowires formed. In preferred embodiments during silicon nanowire formation the pressure is maintained in the range of from 1 to 800 Torr. Preferably the silicon nanowires are formed on a substrate maintained at from 800 to 1000° C.

The present invention may also extend to the formation of nanowires of materials other than silicon, and accordingly viewed from another aspect the present invention provides a method of forming nanowires of M where M is selected from the group consisting of silicon, germanium, carbon or silicon carbide comprising activating vapor phase $M_xO$ (where $x \geq 1$) in an inert gas.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1:
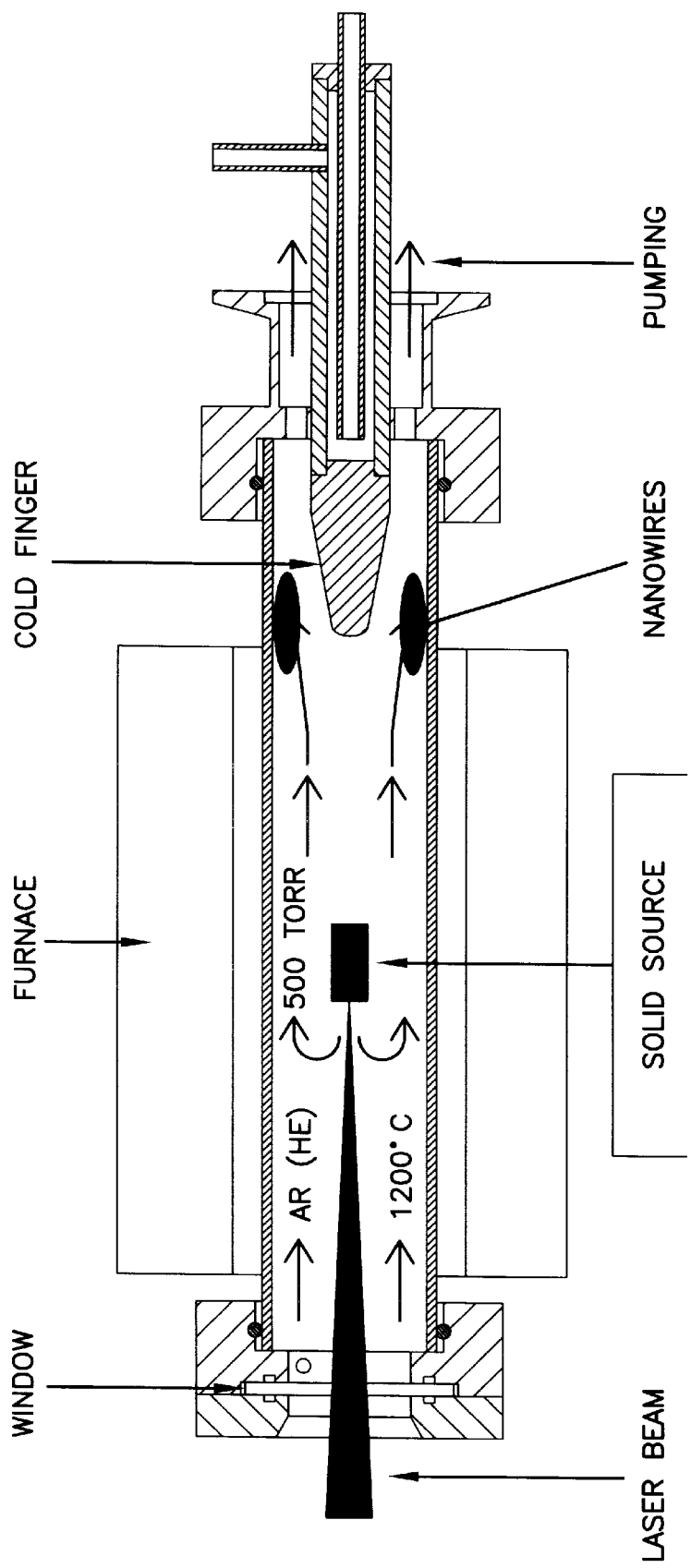
FIG. 1 is a schematic diagram of laser ablation apparatus used for nanowire growth in embodiments of the present invention.
Figure 2:
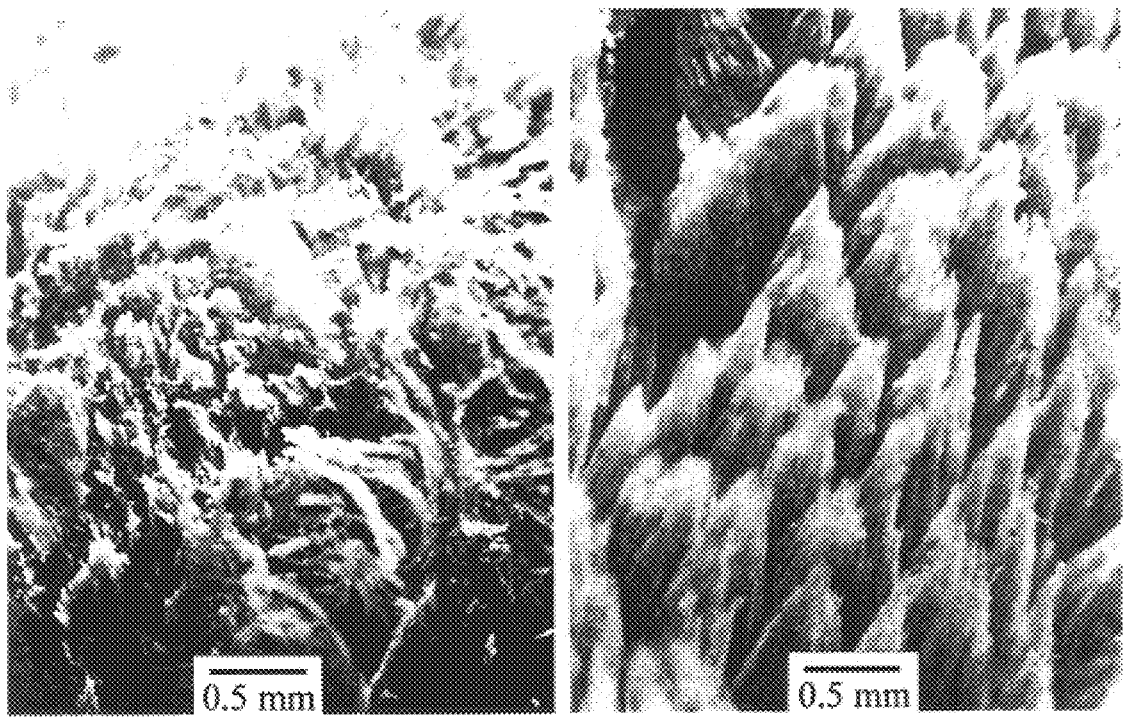
FIG. 2 is a scanning electron microscopy (SEM) micrograph showing the morphology of silicon nanowires grown from silicon monoxide in embodiments of the present invention.
Figure 3:
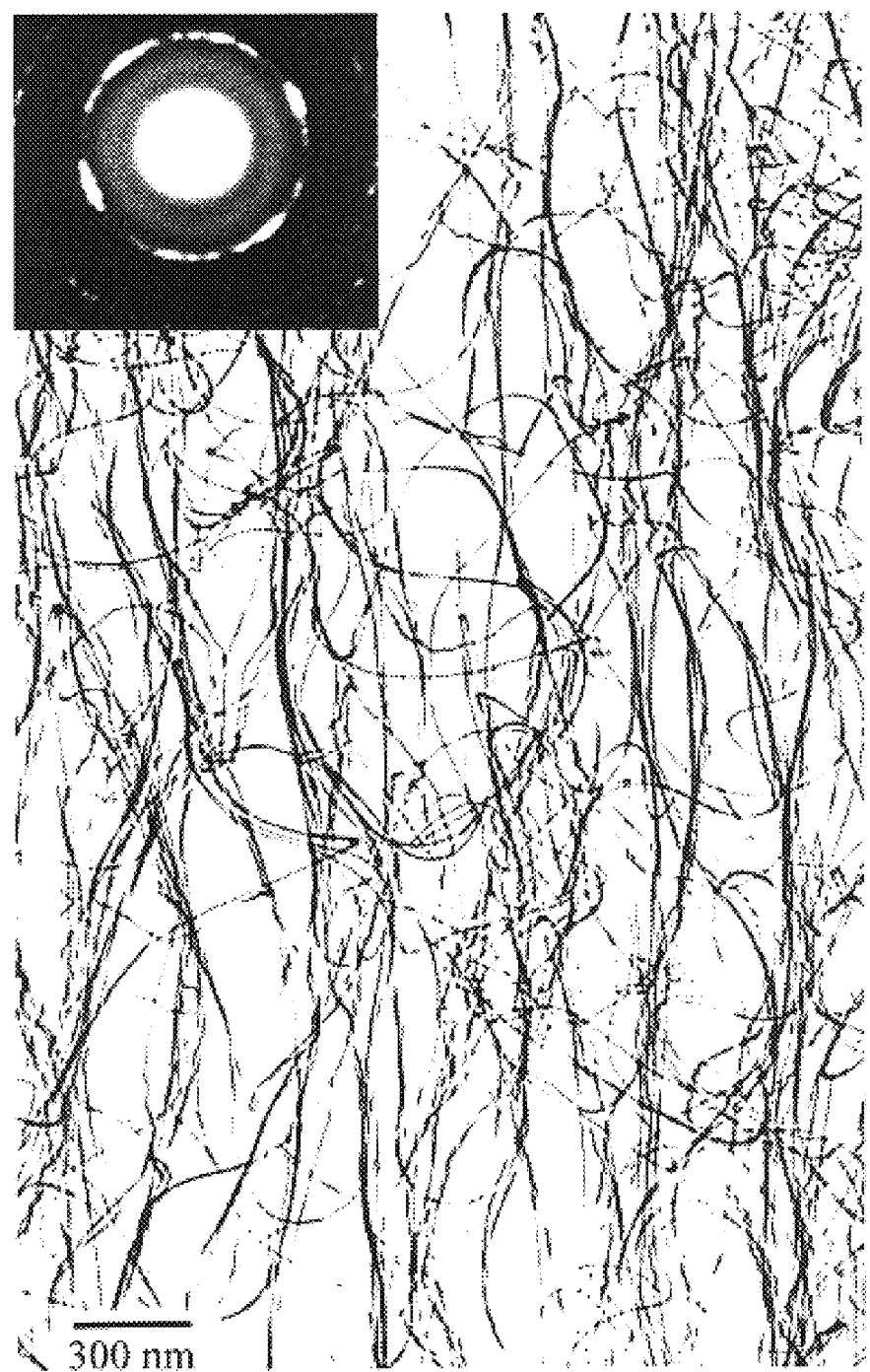
FIG. 3 is a transmission electron microscopic image taken from silicon nanowires grown from silicon monoxide in embodiments of the present invention.
Figure 4:
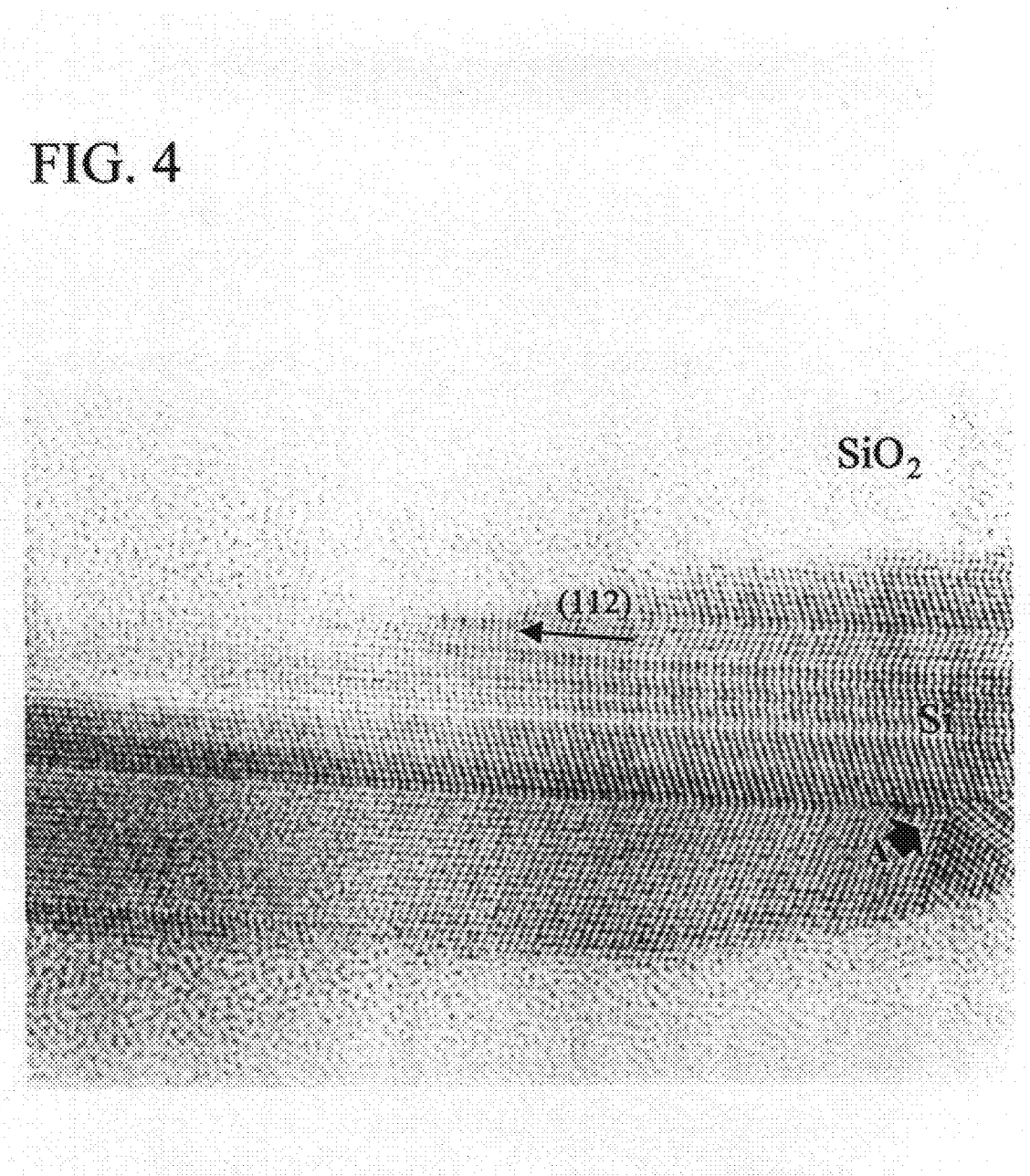
FIG. 4 is a high-resolution transmission electron microscopic image showing the atomic structure of a silicon nanowire grown by an embodiment of the present invention (arrows mark the planar defects of twins and stacking faults)
Figure 5A:
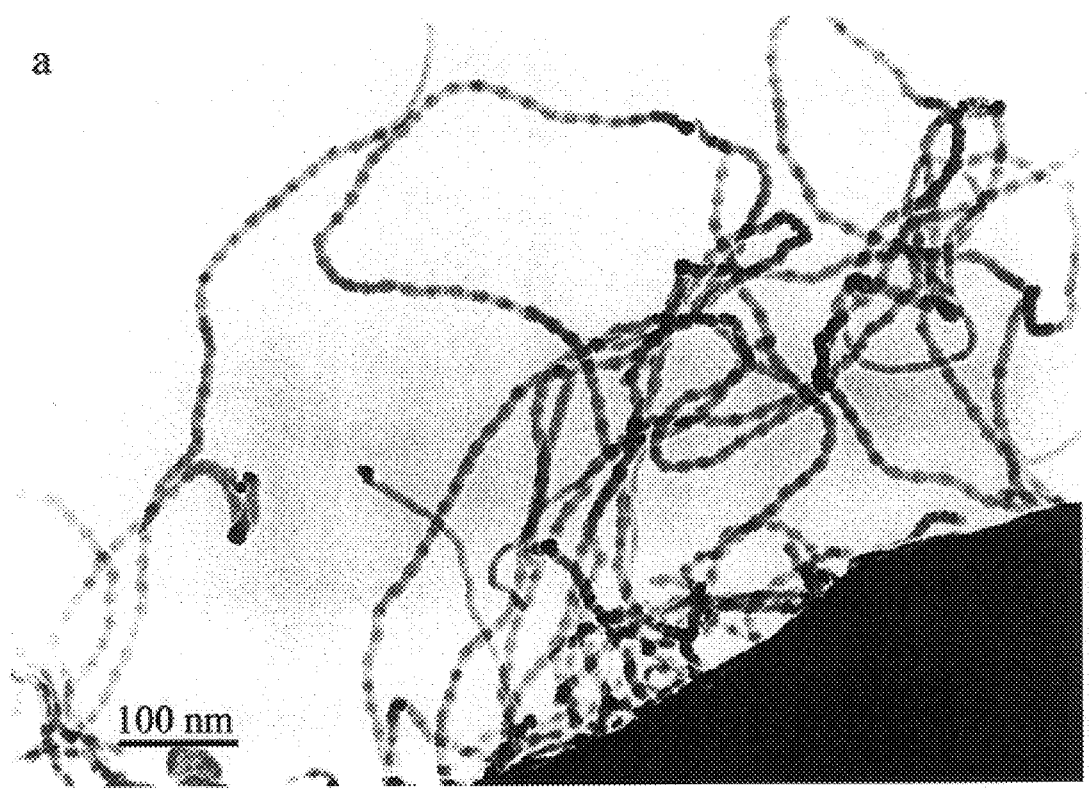
FIG. 5(a) is transmission electron microscopic image illustrating the silicon nanoparticle chains formed in an embodiment of the present invention.
Figure 5B:
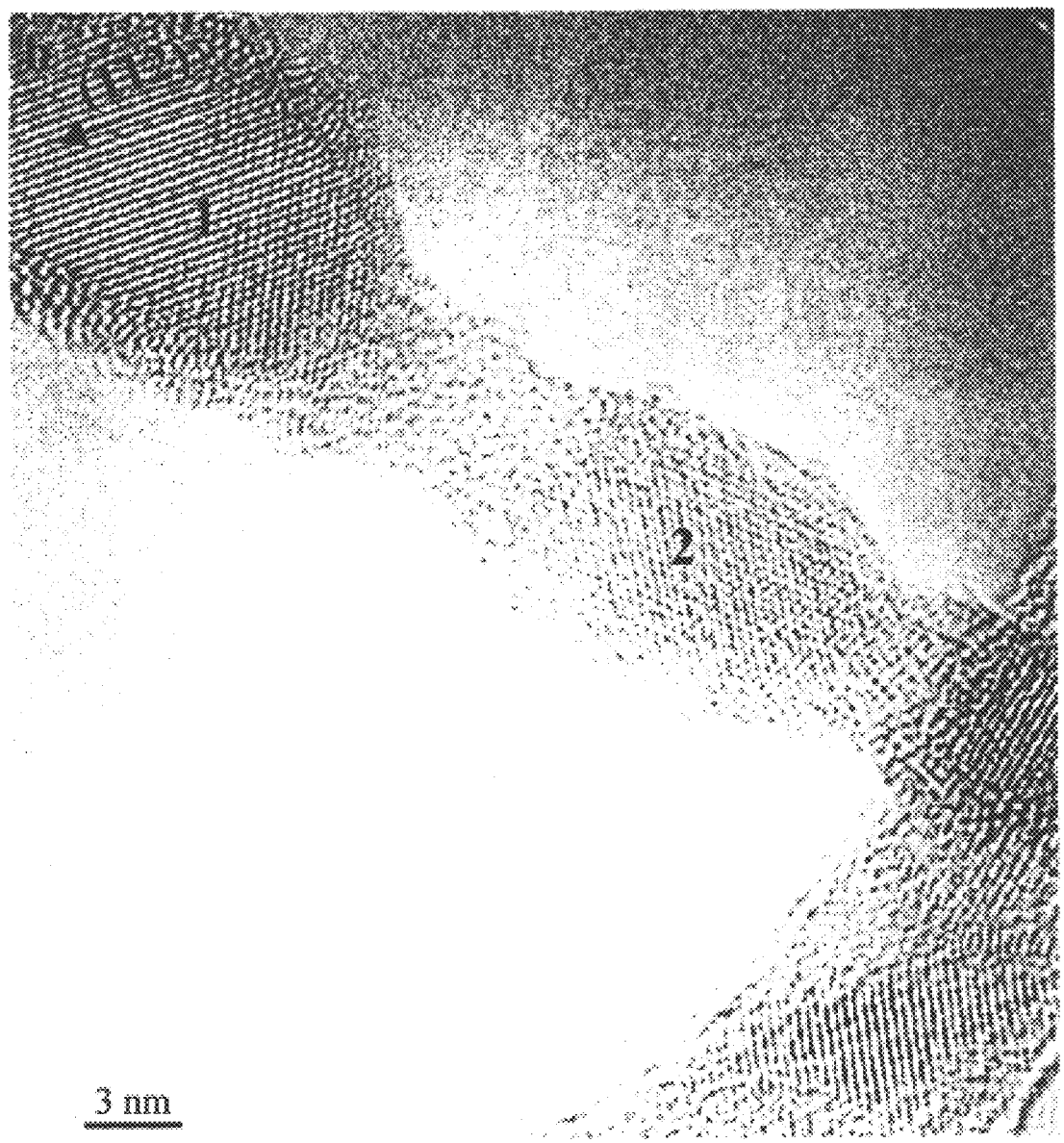
FIG. 5(b) is high-resolution electron microscopic image illustrating the silicon crystalline knots in the nanoparticle chain, and FIGS. 6 (a) and (b) are schematic drawings for silicon nanowire and nanoparticle chain nucleation and growth from silicon monoxide vapor.

FIG. 1 shows a schematic diagram of an apparatus that can be used to produce Si nanowires using the present method. The apparatus consists of a furnace, evacuated tube reaction chamber, high power laser and pumping system. Preferably, silicon monoxide vapor is generated at 1100–1400° C. by thermal heating or laser ablating a solid source. Silicon nanowires grow at 800–950° C. from silicon monoxide. During the growth period, the pressure in the reaction chamber should be maintained at about 1 to 800 Torr, and preferably at 500–600 Torr. Si nanowire product, which is formed at the area where the temperature is 800–1100° C., is sponge-like in shape and dark red in color. FIG. 2 is a scanning electron microscopic image showing the morphology of silicon nanowires. The nanowires grown by this method are generally very long (length≈1–100 μm). As shown in FIG. 3, the diameters of silicon nanowires are very uniform (10 nm–12 nm). The electron diffraction pattern shown in the inset in FIG. 3 evidences that the wires consist of cubic silicon crystalline structure. Each nanowire consists of an outer layer of amorphous silicon oxide and a crystalline silicon core. Planar defects of twins and stacking faults have been observed (shown in FIG. 4 and marked by "A" and the arrow). As a by-product, silicon nanoparticle chains coexist with silicon nanowires (see FIG. 5(a) and (b)).

Applicants theorize that the growth mechanism for silicon nanowires is silicon monoxide (SiO) assisted. The vapor phase of $Si_xO$ (x≧1) generated from a solid source, for example silicon monoxide powder, by thermal evaporation or activated by other methods was the key factor. The nucleation of silicon nanoparticles occurs on a substrate by different decompositions of $Si_xO$ at a temperature range of 800–1000° C. as shown below.

$$Si_xO \rightarrow Si_{x-1} + SiO (x>1)$$

and $$2SiO \rightarrow Si + SiO_2$$

Figure 6A:
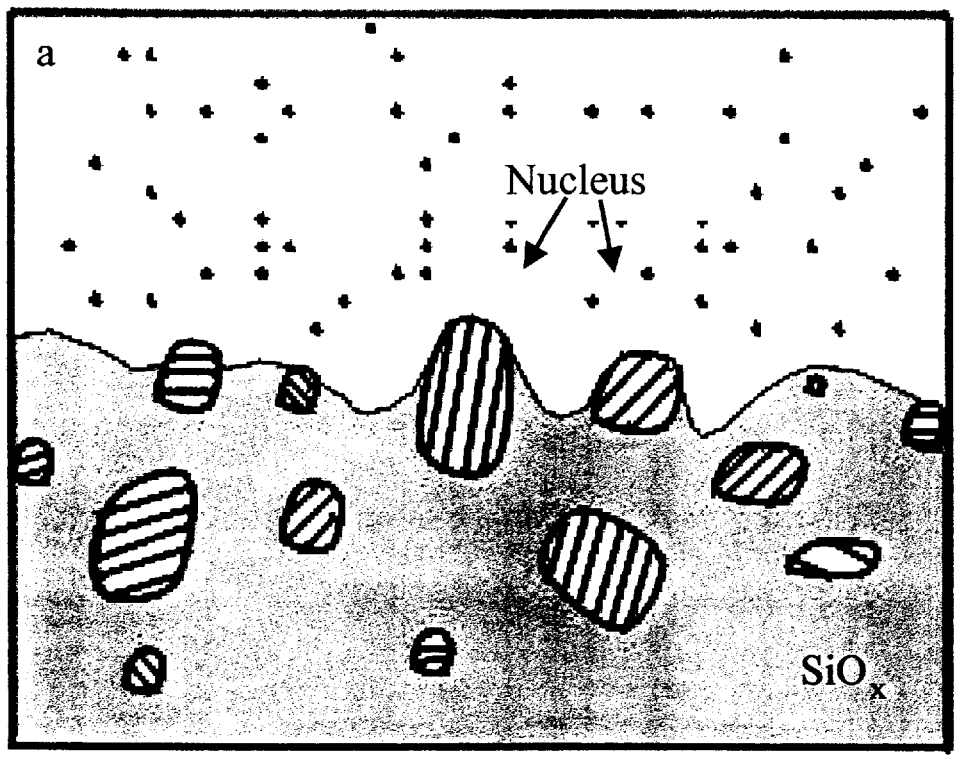

These decompositions result in the precipitation of silicon nanoparticles, i.e. the nuclei of silicon nanowires, clad by shells of silicon oxide as illustrated in FIG. 6(a).

Figure 6B:
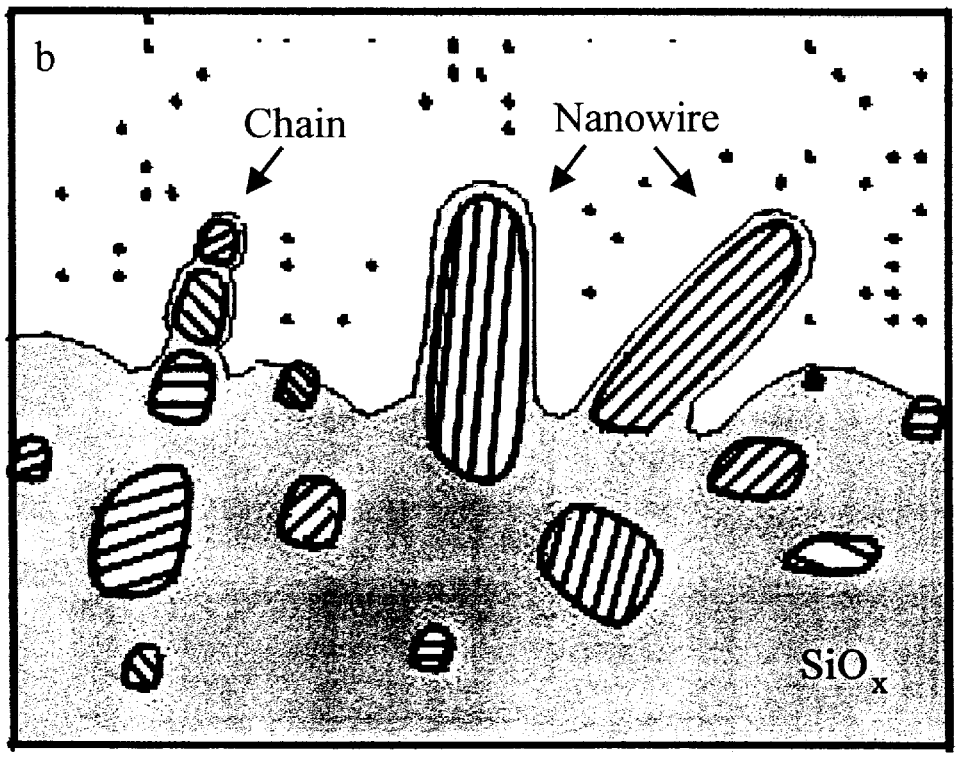

Applicants further theorize that the growth process of silicon nanowire involves the following factors (see FIG. 6(b)). The relatively thick $Si_xO$ on the tips of nanowire acts as a catalyst. The $SiO_2$ component in the shell, which is formed during decomposition of $Si_xO$ for nanowire growth, retards the lateral growth of nanowires. Defects, such as stacking faults in the nucleus tips, enhance the one-dimensional growth. The {111} surface, which has the lowest surface energy among the surfaces in silicon, plays an important role during nanowire growth. Since surface energy is more important when the crystal size is largely reduced down to nanometer scale, the appearance of {111} surfaces of the silicon crystals parallel to the axes of the nanowires reduces the system energy. These factors collectively determine the growth direction of silicon nanowires to be <112>direction. According to Applicant's investigations, nucleation and growth occur at all times during evaporation since the SiO vapor phase is continually generated. Nuclei may form on the nanowire tips with different crystalline orientations during growth. These unfavorable nuclei cannot grow fast along the nanowire and would cause a change of growth direction or re-nucleation. Such re-nucleation processes resulted in the formation of the nanoparticle chains (see FIGS. 5(a) and (b)) which co-existed with the nanowires.

In the present invention, silicon monoxide or suboxide vapor phase is the first key point, and this can be generated by different methods. Heating silicon monoxide powder is a direct way to generate the vapor phase. On the other hand, silicon monoxide or suboxide vapor can be generated by many other means. For example, activating a powder mixture of Si and $SiO_2$ is an effective method of generating silicon monoxide. The activation can be effected in various ways including laser ablation, thermal evaporation, plasma-assisted excitation, chemical vapor deposition etc. Once silicon monoxide is produced, temperature and pressure are very important points for nanowire growth.

EXAMPLE 1

Silicon nanowires are prepared in the apparatus as shown in FIG. 1. The substrate is silicon wafer or $SiO_2$ glass plate. An evacuated quartz tube of 2 inch in diameter is used as the reaction chamber in which Ar, $N_2$, He (500 Torr) or other inert gas flows at 50–300 sccm. The solid source of 1 cm in size is highly pure silicon monoxide powder. The temperature around the source is 1200–1400° C. The substrate temperature is 800–950° C. After one hour of growth, more than 10 mg of silicon nanowires was obtained. The morphology and microstructure of silicon nanowires and silicon nanoparticle chains grown by this method are shown in FIGS. 2–5.

EXAMPLE 2

In this example, the same apparatus shown in FIG. 1 is used. The solid source is a mixture of $SiO_2$ and Si (or Ge) in equal-molar ratio. The temperature around the solid source is about 1200° C. Silicon nanowires grow at about 950° C. The growth rate is slower than that in example 1. The growth time is about 10 hours. In this growth process, silicon monoxide vapor phase was generated by the following reaction in the solid source.

$$Si + SiO_2 \rightarrow 2SiO$$

and $$Ge + SiO_2 \rightarrow SiO + GeO$$

The temperature for this reaction is at least 1100° C. The morphology and microstructure of silicon nanowires and nanoparticle chains are similar to that grown in example 1.

EXAMPLE 3

In this example, the apparatus, solid source and experimental conditions (temperature, pressure, etc.) are the same as that used in example 2. An Excimer laser (wave length= 248 nm, frequency=10 Hz) is used to assist the generation of silicon monoxide vapor phase. The growth rate is increased and the growth time is shortened to 1 hour.

What is claimed is:

1. A method of growing silicon nanowires comprising activating vapor phase silicon monoxide or suboxide carried in an inert gas, wherein silicon nanowires are grown from activating vapor phase silicon monoxide or suboxide.

2. A method as claimed in claim 1 wherein the vapor phase silicon monoxide or suboxide is obtained from a solid source.

3. A method as claimed in claim 2 wherein the solid source comprises silicon monoxide.

4. A method as claimed in claim 2 wherein the solid source comprises silicon dioxide and silicon.

5. A method as claimed in claim 1 wherein the vapor phase is activated by thermal excitation.

6. A method as claimed in claim 1 wherein the vapor phase is activated by laser ablation.

7. A method as claimed in claim 1 wherein the vapor phase is activated by plasma or magnetron sputtering or chemical vapor deposition.

8. A method as claimed in claim 1 wherein the inert gas is selected from the group consisting of neon, argon and helium.

9. A method as claimed in claim 1, wherein during silicon nanowire growth the pressure is maintained in the range from 1 to 800 Torr.

10. A method as claimed in claim 1 wherein the silicon nanowires are grown on a substrate maintained at a temperature ranging from 800 to 1000° C.

11. A method of growing nanowires of M where M is selected from the group consisting of silicon, germanium, carbon or silicon carbide comprising activating vapor phase $M_xO$ (where x>1) in an inert gas, wherein nanowires of M are grown from the group consisting of silicon, germanium, carbon or silicon carbide comprising activating vapor phase $M_xO$.

* * * * *